United States Patent
Zhang et al.

(10) Patent No.: US 9,679,902 B2
(45) Date of Patent: Jun. 13, 2017

(54) LAYOUTS AND FABRICATION METHODS FOR STATIC RANDOM ACCESS MEMORY

(71) Applicant: Semiconductor Manufacturing International (Shanghai) Corporation, Shanghai (CN)

(72) Inventors: Gong Zhang, Shanghai (CN); Yu Li, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/947,196

(22) Filed: Nov. 20, 2015

(65) Prior Publication Data

US 2016/0163716 A1   Jun. 9, 2016

(30) Foreign Application Priority Data

Dec. 4, 2014   (CN) .......................... 2014 1 0734696

(51) Int. Cl.
| | |
|---|---|
| *H01L 27/11* | (2006.01) |
| *H01L 27/02* | (2006.01) |
| *H01L 21/8234* | (2006.01) |
| *H01L 21/84* | (2006.01) |

(52) U.S. Cl.
CPC .. *H01L 27/1104* (2013.01); *H01L 21/823431* (2013.01); *H01L 21/845* (2013.01); *H01L 27/0207* (2013.01)

(58) Field of Classification Search
CPC ............. H01L 27/1104; H01L 27/0207; H01L 21/823431; H01L 21/845
USPC .................. 365/154, 190; 257/206, 208, 390
See application file for complete search history.

(56) References Cited

U.S. PATENT DOCUMENTS

| | | | | |
|---|---|---|---|---|
| 6,924,560 | B2 * | 8/2005 | Wang ..................... | G11C 11/412 257/379 |
| 7,393,733 | B2 * | 7/2008 | Currie ............. | H01L 21/823807 257/E21.633 |
| 7,709,893 | B2 * | 5/2010 | Bauer ................. | H01L 27/0207 257/350 |
| 8,039,179 | B2 * | 10/2011 | Shieh ......................... | G03F 1/36 430/30 |
| 8,040,717 | B2 * | 10/2011 | Ouchi .................... | H01L 21/845 365/154 |
| 8,198,655 | B1 * | 6/2012 | Pileggi ................ | H01L 27/0207 257/206 |
| 8,283,701 | B2 * | 10/2012 | Becker ................ | G06F 17/5068 257/202 |
| 8,362,800 | B2 * | 1/2013 | Or-Bach ............. | H01L 25/0657 326/10 |
| 8,367,498 | B2 * | 2/2013 | Chang ................. | H01L 29/7848 257/E21.409 |

(Continued)

*Primary Examiner* — Vu Le
*Assistant Examiner* — Sung Cho
(74) *Attorney, Agent, or Firm* — Anova Law Group, PLLC

(57) ABSTRACT

A layout of a random access memory is provided. The layer comprises a first sub-layout having a first pattern including a first number (N1) of first patterns and an adjacent second pattern having a second number (N2) of second patterns; a second sub-layout having a first gate pattern and a second gate pattern; and an interchangeable third sub-layout having covering patterns variable for forming different static random access memory when used with the first sub-layout and the second sub-layout.

20 Claims, 5 Drawing Sheets

(56) References Cited

U.S. PATENT DOCUMENTS

| | | | |
|---|---|---|---|
| 8,490,244 B1* | 7/2013 | Joshi | G06F 17/5018 716/110 |
| 8,569,125 B2* | 10/2013 | Standaert | H01L 29/785 257/E21.409 |
| 8,575,703 B2* | 11/2013 | Ishizu | H01L 27/0207 257/202 |
| 8,621,398 B2* | 12/2013 | Shen | H01L 21/823431 716/132 |
| 8,658,542 B2* | 2/2014 | Smayling | H01L 21/027 257/E21.517 |
| 8,659,072 B2* | 2/2014 | Ou | H01L 27/0886 257/328 |
| 8,769,446 B2* | 7/2014 | Wang | G06F 17/5068 716/55 |
| 8,863,063 B2* | 10/2014 | Becker | H01L 27/092 716/118 |
| 8,881,084 B2* | 11/2014 | Shen | G06F 17/5081 716/122 |
| 9,318,477 B2* | 4/2016 | Lee | H01L 27/0207 |
| 2004/0099885 A1* | 5/2004 | Yeo | H01L 27/11 257/208 |
| 2005/0077550 A1* | 4/2005 | Inaba | H01L 21/28132 257/250 |
| 2005/0094434 A1* | 5/2005 | Watanabe | G11C 11/412 365/156 |
| 2006/0121715 A1* | 6/2006 | Chang | H01L 27/11 438/599 |
| 2008/0308850 A1* | 12/2008 | Berthold | H01L 21/84 257/288 |
| 2011/0195564 A1* | 8/2011 | Liaw | G11C 11/412 438/585 |
| 2012/0299106 A1* | 11/2012 | Mann | H01L 21/823821 257/351 |
| 2013/0154027 A1* | 6/2013 | Liaw | H01L 27/1104 257/390 |
| 2013/0181297 A1* | 7/2013 | Liaw | G11C 11/412 257/390 |
| 2014/0061801 A1* | 3/2014 | Doornbos | H01L 21/823807 257/351 |
| 2014/0097493 A1* | 4/2014 | Baek | H01L 27/1211 257/347 |
| 2014/0131813 A1* | 5/2014 | Liaw | H01L 27/1104 257/401 |
| 2014/0151812 A1* | 6/2014 | Liaw | H01L 21/76895 257/368 |
| 2015/0064869 A1* | 3/2015 | Hong | H01L 21/823821 438/283 |
| 2015/0084129 A1* | 3/2015 | Lee | H01L 29/6681 257/347 |
| 2015/0091188 A1* | 4/2015 | Lee | H01L 27/0207 257/774 |
| 2015/0243667 A1* | 8/2015 | Liaw | H01L 27/1104 257/390 |
| 2015/0294976 A1* | 10/2015 | Kim | H01L 27/1104 438/702 |

* cited by examiner

LAYOUTS AND FABRICATION METHODS FOR STATIC RANDOM ACCESS MEMORY

CROSS-REFERENCES TO RELATED APPLICATIONS

This application claims the priority of Chinese patent application No. 201410734696.0, filed on Dec. 4, 2014, the entirety of which is incorporated herein by reference.

FIELD OF THE INVENTION

The present invention generally relates to the field of semiconductor technology and, more particularly, relates to cell layouts of static random access memory (SRAM) and fabrication processes of SRAM.

BACKGROUND

SRAM, as a typical type of memory, has advantages including high speed, low power consumption, and standard process compatibility, etc. The SRAM is widely used in computers, personal communication devices, and consumer electronics (intelligent cards, digital cameras, or multiple media players, etc.), etc.

With the continuous development of semiconductor technology, the technical node has become smaller and smaller, and multiple-gate devices have attracted more and more attentions. Fin field-effect transistors (FinFETs) are a common type of multiple-gate devices which has been widely used in the SRAMs. FinFETs are able to effectively enhance the performance of SRAMs.

A SRAM unit often includes two pull-up (PU) transistors, two pull-down (PD) transistors, and two pass-gate (PG) transistors. The two PU transistors are two PMOS transistors. The two PD transistors are NMOS transistors. The two PG transistors are also two NMOS transistors.

For high quality SRAMs, the PD transistors, the PU transistors and the PG transistors may need different drive currents, such as read current ($I_{read}$), or stand-by current ($I_{sby}$), etc., to match the performance requirements. The drive current of a FinFET is proportional to the area of its channel region. Thus, the drive current of the FinFET is able to be adjusted by varying the area of the channel region. In existing techniques, the fin size and the gate size of the FinFETs in a SRAM unit are the same. Thus, the FinFETs having single fins have a same channel area. Therefore, in order to increase the drive currents of the FinFETs, it requires the FinFETs to have multiple fins.

Currently, according to the performance requirements of different SRAMs, the PU transistors, the PD transistors and the PG transistors need different numbers of fins, respectively. Thus, in the cell layout design, the fin frames are different for different SRAM cells; and the cells with different sizes have to be designed separately.

However, according to the present disclosure, such cell layout designs have a plurality of issues. First, the cell layouts of different structures (source, drain, and gate, etc.) cannot be shared. Further, it requires different periphery circuits for different structures. Further, it is relatively complex to change the masks with different cell layouts for different structures during the fabrication process. Further, more mask area may be needed because the areas of the cells are different. Therefore, the research and development cost of SRAMs are relatively high. The disclosed device structures and methods are directed to solve one or more problems set forth above and other problems.

BRIEF SUMMARY OF THE DISCLOSURE

One aspect of the present disclosure includes a layout of a random access memory. The layout comprises a first sub-layout having a first pattern including a first number (N1) of first patterns and an adjacent second pattern having a second number (N2) of second patterns; a second sub-layout having a first gate pattern and a second gate pattern; and an interchangeable third sub-layout having covering patterns variable for forming different static random access memory when used with the first sub-layout and the second sub-layout.

Another aspect of the present disclosure includes a method for fabricating a static random access memory. The method includes providing a layout having a first pattern including a first number of first fin patterns and an adjacent second pattern having a second number of second fin patterns, a second sub-layout having a first gate pattern and a second gate pattern, and a changeable third sub-layout having covering patterns variable for forming different static random memory when used with the same first sub-layout and the same second sub-layout. The method also includes providing a semiconductor substrate; and forming a plurality of first fins and a plurality of second fins on the semiconductor substrate using the first sub-layout. Further, the method includes removing portions of the first fins and the second fins corresponding to portions of the first fin patterns and the second fin patterns covered by the covering patterns of the third sub-layout; and forming a first gate and a second gate over the remaining first fins and second fins using the second sub-layout.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
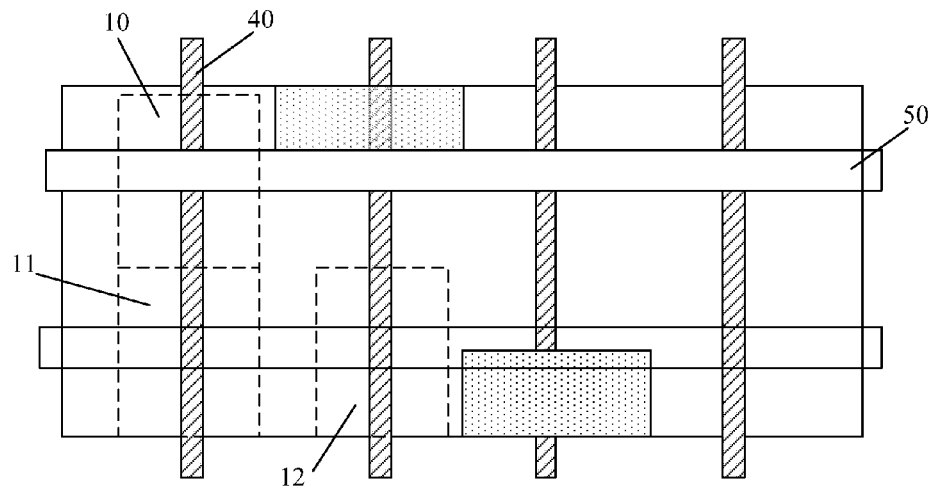
FIGS. 1-3 illustrate existing cell layouts of three different SRAMs.

FIG. 1 illustrates an existing cell layout of a SRAM having a PU transistor 12, a PD transistor 11, and a PG transistor 10. As shown in FIG. 1, the PU transistor 12 of the SRAM has one fin 40. The PD transistor 11 of the SRAM has one fin 40. The PG transistor of the SRAM has one fin 40. The gate patterns 50 are over the fins 40. The entire SRAM unit includes four parallel fins 40.

Figure 2:
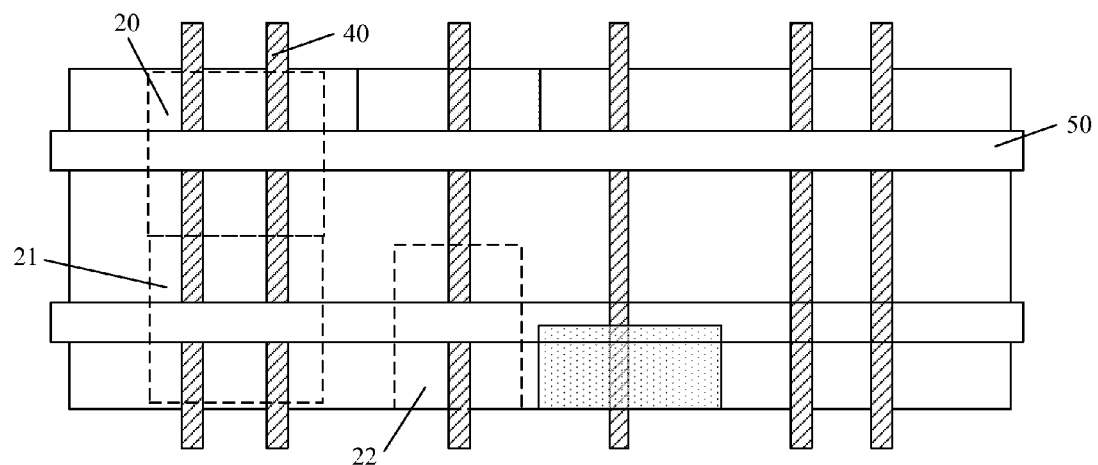

FIG. 2 illustrates another existing cell layout of a SRAM having a PU transistor 22, a PD transistor 21, and a PG transistor 20. As shown in FIG. 2, the PU transistor 22 has one fin 40. The PD transistor has two fins 40. The PG transistor 20 has two fins 40. The gate patterns 50 are over the fins 40. The entire SRAM unit includes six parallel fins 40.

Figure 3:
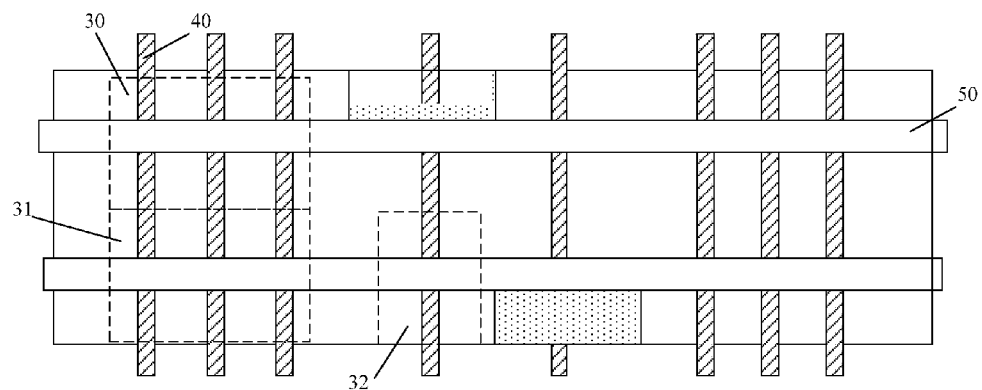

FIG. 3 illustrates another existing cell layout of a SRAM having a PU transistor 32, a PD transistor 31, and a PG transistor 30. The PU transistor 32 has one fin 40, the PD transistor 31 has three fins 40. The PG transistor 30 has three fins 40. The gate patterns 50 are over the fins 40. The entire SRAM unit includes eight parallel fins 40.

According to FIGS. 1~3, when the structures of the SRAMs are different, the areas of the SRAM units (may be refereed as a cell size of in the layout) are different. Thus, each cell may need to be designed and fabricated separately; and the research and development cost may be relatively high. According to the disclosed cell layout designs, two sub-layouts of the cell layout may be kept same; and it may only need to change the third sub-layout to fabricate different SRAMs corresponding to the cell layouts illustrated in FIGS. 1~3, and other SRAMs with different structures.

Figure 4:
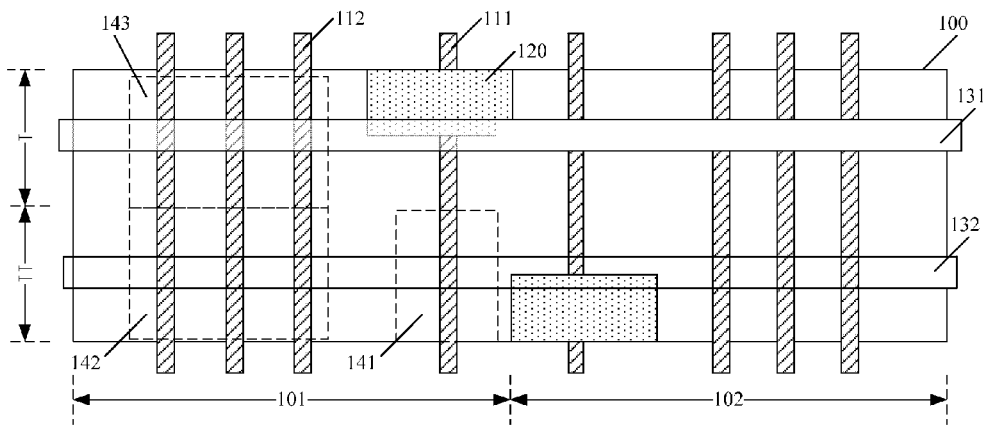
FIGS. 4-8 illustrate cell layouts of different SRAMs consistent with the disclosed embodiments.

FIG. 4 illustrates an exemplary cell layout of a SRAM consistent with the disclosed embodiments. The cell layout 100 of the SRAM may include a first sub-layout (not labeled) on its bottom, a second sub-layout (not labeled) above the first sub-layout, and a third sub-layout (not labeled) disposed between first sub-layout and the second sub-layout.

As shown in FIG. 4, the first sub-layout of the layout 100 of the SRAM may include a first pattern (not labeled) and an adjacent second pattern (not labeled). The first pattern may include a plurality of parallel first fin patterns 111. The number of the first fin patterns may be referred as a first number "N1". The second pattern may include a plurality of second fin patterns 112. The number of the second fin patterns may be referred as a second number "N2". N2 may be greater than N1.

Further, the first sub-layout may be have a first region I and a second region II along the longitudinal direction of the first fin patterns 111 and the second fin patterns 112. The second fin patterns 112 in the first region I may be corresponding to the fins of the PG transistor of the SRAM. The second fin patterns 112 in the second region II may be corresponding to the fins of the PD transistor of the SRAM. The first fin pattern 111 in the first region I may be corresponding to the PU transistor of the SRAM.

Further, the first sub-layout may have a first part 101 and a second part 102 along the direction perpendicular to the first fin pattern 111 and the second fin patterns 112. Thus, the first fin pattern 111 and the second fin patterns 112 may be in the first part 101. The patterns in the first part 101 and the patterns in the second part 102 may be centrosymmetric. For illustrative purposes, only the patterns in the first pan are described.

The first number (N1) of the first fin patterns 111 and the second number (N2) of the second fin patterns 112 may be any appropriate value. In one embodiment, as shown in FIG. 4, N1 is equal to 1, and N2 is equal to 3. In certain other embodiments, the first number (N1) of the first fin patterns 111 and the second number (N2) of the second fin patterns 112 may have a ratio as N1:N2=3. For example when N1 is equal to 2, N2 is equal to 6. In a regular SRAM, the number of the PD transistors and the number of the PU transistors may have a ratio smaller or equal to 3. Thus, when N1:N2=3, it may match the requirements of the majority of SRAMs.

The second sub-layout of the cell layout 100 of the SRAM is over the first sub-layout. The second sub-layout may include one first gate pattern 131 and one second gate pattern 132 parallel to the first gate pattern 131. The first gate pattern 131 may be used to form the gate structure of the PG transistor; and the second gate pattern 132 may be used to form the gate structure of the PD transistor and the PU transistor.

Further, the second sub-layout of the cell layout 100 may have a third part (not labeled) and a fourth part (not labeled) along a direction parallel to the first gate pattern 131 and the second gate pattern 132. The first gate pattern 131 and the second gate pattern 132 may be in the third part. The patterns in the fourth part and the patterns in the third part may be centrosymmetric. For illustrative purposes, only the patterns in the third part are described.

When the second sub-layout entirely overlaps with the first sub-layout, the longitudinal direction of the first gate pattern 131 and the second gate pattern 132 may be perpendicular to the longitudinal direction of the first fin pattern 111 and the second fin patterns 122. Further, the first gate pattern 131 may be over the portion of the first fin pattern 111 in the first region I and the portions of the second fin patterns 112 in the first region I. Further, the second gate pattern 132 may be over the portion of the first fin pattern 111 in the second region II and the portions of the second pattern 112 in the second region II. The first gate pattern 131 and the second gate pattern 132 in the second sub-layout may be corresponding to the gate patterns of the SRAM in a fabrication process.

Further, referring to FIG. 4, the portion of the first gate pattern 131 and the portions of the second fin patterns 112 in the first region I may form a PG transistor pattern 143 (in the dashed frame). The portion of the second gate pattern 132 and the portions of the second fin patterns 112 in the second region II may form a PD transistor pattern 142 (in the dashed frame). The portion of the second gate pattern 132 and the portion of the first fin pattern 111 in the second region II may form a PU transistor pattern 141 (in the dashed frame). The PG transistor pattern 143, the PD transistor pattern 142 and the PU transistor pattern 141 may be corresponding to the PG transistor, the PD transistor and the PU transistor of the SRAM, respectively, in a fabrication process of the SRAM.

Further, the third sub-layout may be in between the first sub-layout and the second sub-layout. As shown in FIG. 4, the third sub-layout may include a covering pattern 120. The covering pattern 120 may be corresponding to the active region (AR) of the SRAM structure.

Referring to FIG. 4, the third sub-layout may have a fifth part (not labeled) and a sixth part (not labeled) along a direction perpendicular to the first fin pattern 111 and the second fin patterns 112. The covering pattern 120 may be in the fifth part. The patterns in the fifth part and the patterns in the second part may be centrosymmetric. For illustrative purposes, only the patterns in the fifth part are described.

In one embodiment, the number of the fins in the PU transistor of the SRAM may be retired as a third number "n1"; and n1=1. The number of the fins in the PD transistor of the SRAM may be referred as a fourth number "n2"; and n2=2. The number of the fins in the PG transistor of the SRAM may be referred as a fifth number and n3=3. Referring to FIG. 4, in the cell layout 100 of the SRAM, the first sub-layout, the second sub-layout and the third layout may entirely overlap with each other. By an appropriate design, the covering pattern 120 may cover the first number (N1) of first fin patterns 111 in the first region I; a sixth number (N2-n3) of second fin patterns 112 in the first region; a seventh number (N2-n2) of second fin patterns 112 in the second region II; and an eighth number (N1-n1) of first fin patterns 111 in the first region I. The first fin patterns 111 and the second fin patterns 112 covered by the covering pattern 120 may be corresponding to the portions of the fins on the substrate needed to be removed.

In one embodiment, N1=1, N2=3, n1=1, n2=3, and n3=3. Thus, the covering pattern 120 may cover one first fin pattern 111 in the first region I, zero second fin pattern 112 in the first region I, zero second fin pattern 112 in the second region II, and zero first fin pattern 111 in the second region II. Thus, referring to FIG. 4, the covering pattern 120 in the third sub-layout may only cover one first fin pattern 111 in the first region I.

Referring to FIG. 4, the covering pattern 120 may cover a portion of the first fin pattern 111 under the first gate pattern 131 and the portion of the first pattern 111 near to the edge of the first sub-layout. A portion of the remaining portion of the first fin pattern 111 may be under the first gate pattern 131. When the SRAM is being formed, the adverse effect to the PU transistor 141 may be avoided. In one embodiment, the length of the portion of the first fin pattern 111 under the first gate pattern 131 without being covered by the covering pattern 120 may be equal to approximately one half of the width of the first gate pattern 131.

Further, referring to FIG. 4, the first part 101 of the first sub-layout, the third part of the second sub-layout, and the fifth part of the third sub-layout may entirely overlap. The second part 102 of the first sub-layout, the fourth part of the second sub-layout, and the sixth part of the third sub-layout may entirely overlap. The patterns in first part, the third part, and the fifth part may together be used to form a PU transistor, a PD transistor, and PG transistor. The PU transistor, the PD transistor and the PG transistor may form a first inverter.

The patterns in the first part, the third part and the fifth part may be centrosymmetric with the patterns in the second part, the fourth part, and the sixth part. Thus, the patterns in the second part, the fourth part and the sixth part may be used to form a second PU transistor, a second PD transistor and a second PG transistor. The second PU transistor, the second PD transistor, and the second PG transistor may form a second inverter. The first inverter and the second inverter may be centrosymmetric. Thus, the SRAM may be formed by the first inverter and the second inverter. Such a SRAM may be referred as a 6T SRAM. Therefore, referring to FIGS. 3~4, the cell layout 100 may be identical to the cell layout illustrated in FIG. 3.

In certain other embodiments, the fourth number (n2) of fins of the PD transistor of the SRAM may be in a range of 1~3. The third number (n1) of fins of the PU transistor of the SRAM may be 1. The fifth number (n3) of fins of the PG transistor of the SRAM may be in a range of 1~3.

In still certain other embodiments, the fourth number (n2) of fins of the PD transistor of the SRAM is 2. The third number (n1) of fins of the PU transistor of the SRAM is 1. The fifth number (n3) of the fins of the PG transistor of the SRAM is 2.

Figure 5:
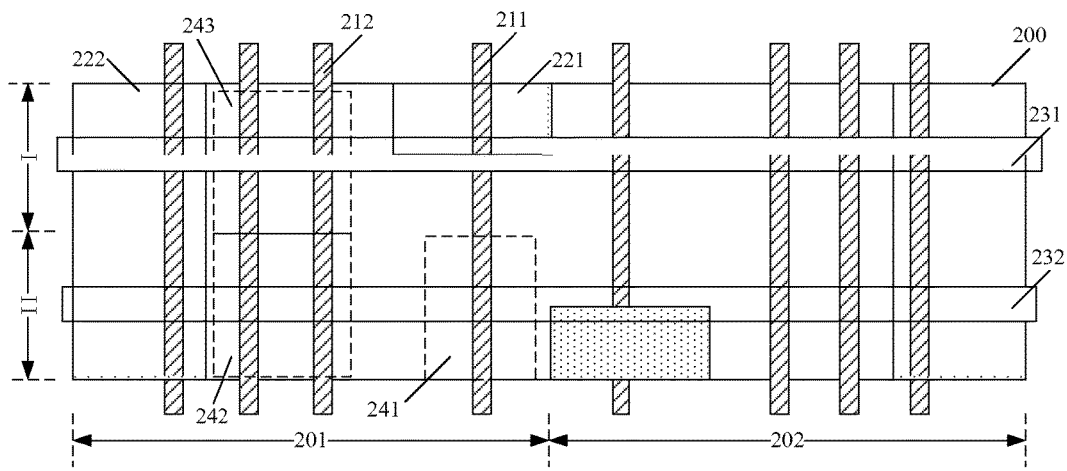

FIG. 5 illustrates another exemplary cell layout of a SRAM consistent with the disclosed embodiments. The cell layout 200 of the SRAM may include a first sub-layout (not labeled) on its bottom, a second sub-layout (not labeled) above the first sub-layout, and a third sub-layout (not labeled) disposed between first sub-layout and the second sub-layout.

As shown in FIG. 5, the first sub-layout of the cell layout 200 of the SRAM may include a first pattern (not labeled) and an adjacent second pattern (not labeled). The first pattern may include a plurality of parallel first fin patterns 211. The number of the first fin patterns may be referred as a first number "N21". The second pattern may include a plurality of second fin patterns 212. The number of the second fin patterns 212 may be referred as a second number "N22". N22 may be greater than N21. In one embodiment, N21=1; and N22=3. Therefore, the first sub-layout of the cell layout 200 may be identical to the first sub-layout of the cell layout 100.

Further, the first sub-layout may have a first region I and a second region II along the longitudinal direction of the first fin pattern 211 and the second fin patterns 212. The second fin patterns 212 in the first region I may be corresponding to the fins of the PG transistor of the SRAM. The second fin patterns 212 in the second region II may be corresponding to the fins of the PD transistor of the SRAM. The first fin pattern 211 in the first region I may be corresponding to the fin of the PU transistor of the SRAM during a process for forming the SRAM Further, the first sub-layout may have a first part 201 and a second part 202 along the direction perpendicular to the first fin pattern 211 and the second fin patterns 212. Thus, the first fin pattern 211 and the second fin patterns 212 may be in the first part 201. The patterns in the first part 201 and the patterns in the second part 202 may be centrosymmetric. For illustrative purposes, only patterns in the first part 201 are described.

The second sub-layout of the cell layout 200 of the SRAM is over the first sub-layout. The second sub-layout may include one first gate pattern 231 and one second gate pattern 232 parallel to the first gate pattern 231. The first gate pattern 231 may be used to form the gate structure of the PG transistor, and the second gate pattern 232 may be used to form the gate structure of the PD transistor and the PU transistor. Referring to FIG. 4, the second sub-layout of the cell layout 200 may be identical to the second sub-layout of the cell layout 100.

Further, the second sub-layout of the cell layout 200 may have a third part (not labeled) and a fourth part (not labeled) along a direction parallel to the first gate pattern 231 and the second gate pattern 232. The first gate pattern 231 and the second gate pattern 232 may be in the third part. The patterns in the fourth part and the patterns in the third part may be centrosymmetric. For illustrative purposes, only the patterns in the third part are described.

When the second sub-layout entirely overlaps with the first sub-layout, the longitudinal direction of the first gate pattern 231 and the second gate pattern 232 may be perpendicular to the longitudinal direction of the first fin pattern 211 and the second fin pattern 222. Further, the first gate pattern 231 may be over the portion of the first fin pattern 211 in the first region I and the portions of the second fin patterns 212 in the first region I. Further, the second gate pattern 232 may be over the portion of the first fin pattern 211 in the second region II and the portions of the second patterns 212 in the second region II. The first gate pattern 231 and the second gate pattern 232 in the second sub-layout may be corresponding to the gate patterns of the SRAM in a fabrication process.

Further, referring to FIG. 5, the portion of the first gate pattern 231 and the portions of the second fin patterns 212 in the first region I may form a PG transistor pattern 243 (in the dashed frame). The portion of the second gate pattern 232 and the portions of the second fin patterns 212 in the second region II may form a PD transistor pattern 242 (in the dashed frame). The portion of the second gate pattern 232 and the portion of the first fin pattern 211 in the second region II may form a PU transistor pattern 241 (in the dashed frame). The PG transistor pattern 243, the PD transistor pattern 242 and the PU transistor pattern 241 may be corresponding to the PG transistor, the PD transistor and the PU transistor of the SRAM, respectively, in a process for forming the SRAM.

Further, the third sub-layout may be in between the first sub-layout and the second sub-layout. As shown in FIG. 5, the third sub-layout may include a first covering pattern 221 and a second covering pattern 222.

Referring to FIG. 5, the third sub-layout may have a fifth part (not labeled) and a sixth part (not labeled) along a direction perpendicular to the first fin pattern 211 and the second fin patterns 212. The first covering pattern 221 and the second coveting pattern 222 may be in the fifth part. The patterns in the fifth part and the patterns in the second part may be centrosymmetric. For illustrative purposes, only the patterns in the fifth part are described.

Further, in one embodiment, the number of the fins in the PU transistor of the SRAM may be referred as a third number "n21"; and n21=1. The number of the fins in the PD transistor of the SRAM may be referred as a fourth number "n22"; and n22=2. The number of the fins in the PG transistor of the SRAM may be referred as a fifth number "n23", and n23=2. Referring to FIG. 5, in the cell layout 200 of the SRAM, the first sub-layout, the second sub-layout and the third layout may entirely overlap with each other. By an appropriate design, the first covering pattern 221 may cover the first number (N21) of the first fin patterns 111 in the first region I. The second covering pattern 222 may cover a sixth number (N22-n23) of second fin patterns 212 in the first region I, a seventh number (N22-n22) of second fin patterns 112 in the second region II; and an eighth number (N21-n21) of first fin patterns 211 in the first region I. The first fin pattern 211 and the second fin patterns 212 covered by the first covering pattern 221 and the second covering pattern 222 may be corresponding to the portions of the fins on the substrate needed to be removed during a process for forming the SRAM.

In one embodiment, N21=1, N22=3, n21=1, n22=2, and n23=2. Thus, N22-n23=1; N22-n22=1; and N21-n21=0. Thus, the first covering pattern 221 may cover one first fin pattern 211 in the first region I; and the second covering pattern 222 may cover one second fin pattern 212 in the first region I; and one second fin pattern 212 in the second regions II. That is, referring to FIG. 5, the second covering pattern 222 covers the entire second fin pattern 212 in the first region I and the second region II. In one embodiment, the second fin pattern 212 covered by the second covering pattern 222 may be the most outside one in the cell layout 200. Thus, the area of the second covering pattern 222 may be relatively large.

In a practical photolithography process, the process window may be relatively large. Thus, it may avoid damaging the adjacent second fin patterns 212. Further, when a plurality of SRAM units are formed, the second covering patterns 222 of the third sub-layouts of the adjacent SRAM units may form a continuous pattern. In certain other embodiments, the second covering pattern 222 may also cover other second fin patterns 212 in other positions. The covered second fin pattern 212 and the covered portion of the first fin patterns 211 may be corresponding to the fins and the portions of the fins needed to be removed from the substrate when the SRAM is being formed.

Further, referring to FIG. 5, the first covering pattern 221 may cover the portion of the first fin pattern 211 under the first gate pattern 231 and the portion of the first fin pattern 211 near the edge of the cell layout 200. A portion of the remaining portion of the first fin pattern 211 may be under the first gate pattern 231. When the SRAM is being formed, the adverse effect to the PU transistor pattern 241 may be avoided. In one embodiment, the length of the portion of the first fin pattern 211 under the first gate pattern 231 without being covered by the first covering pattern 221 may be equal to approximately one half of the width of the first gate pattern 231.

Further, referring to FIG. 5, the first part 201 of the first sub-layout, the third part of the second sub-layout and the fifth part of the third sub-layout may entirely overlap. The second part 202 of the first sub-layout the fourth part of the second sub-layout and the sixth part of the third sub-layout may entirely overlap. The patterns in first part 201, the third part and fifth part may together be used to form a PU transistor, a PD transistor, and PG transistor. The PU transistor, the PD transistor and the PG transistor may form a first inverter. The patterns in the first part, the third part and the fifth part may be centrosymmetric with the patterns in the second part, the fourth part and the sixth part. Thus, the patterns in the second part, the fourth part and the sixth part may be used to form a second PU transistor, a second PD transistor and a second PG transistor. The second PU transistor, the second PD transistor and the second PG transistor may form a second inverter. The first inverter and the second inverter may be centrosymmetric. Thus, the SRAM may be formed by the first inverter and the second inverter. Such a SRAM may be referred as a 6T SRAM.

Therefore, by keeping the first sub-layout and the second sub-layout to be identical to the first sub layout and the second sub-layout of the cell layout 100; and properly designing the covering patterns on the third sub-layout, the SRAM formed using the cell layout 200 may be identical to the SRAM formed using the cell layout illustrated in FIG. 2. That is, it may only need to change the third sub-layout to form two different SRAM structures; and the first sub-layout and the second sub-layout may be kept same.

Figure 6:
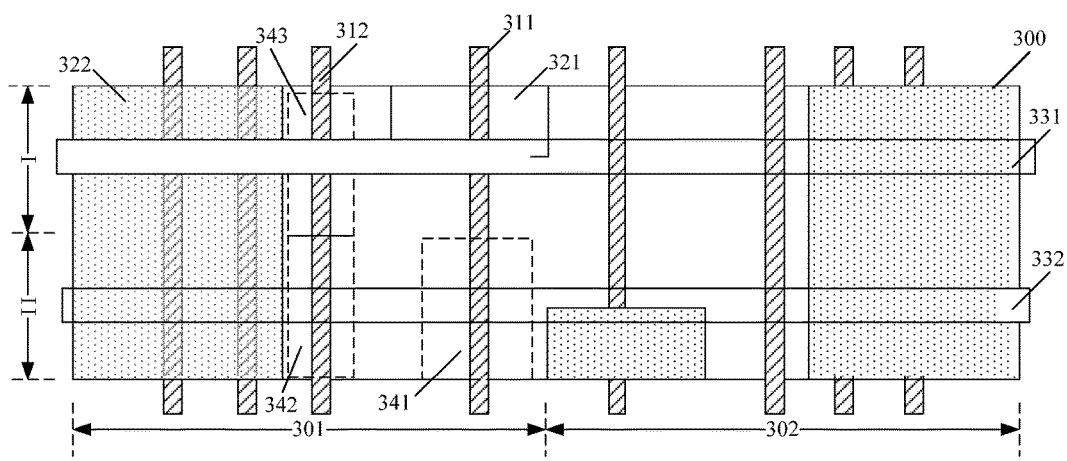

FIG. 6 illustrates another exemplary cell layout of a SRAM consistent with the disclosed embodiments. The cell layout 300 of the SRAM may include a first sub-layout (not labeled) on its bottom, a second sub-layout (not labeled) above the first sub-layout, and a third sub-layout (not labeled) disposed between the first sub-layout and the second sub-layout.

As shown in FIG. 6, the first sub-layout of the cell layout 300 of the SRAM may include a first pattern (not labeled) and an adjacent second pattern (not labeled). The first pattern may include a plurality of parallel first fin patterns 311. The number of the first fin patterns may be referred as a first number "N31". The second patterns may include a plurality of parallel second fin patterns 312. The number of the second fin patterns 212 may be referred as second number "N32". N32 may be greater than N31. In one embodiment, N31=1 and N32=3. Therefore, the first sub-layout of the cell layout 300 may be identical to the first sub-layout of the cell layout 100, and the first sub-layout of the cell layout 200.

Further, in one embodiment, the number of the fins in the PU transistor of the SRAM may be referred as a third number (n31); and n31=1. The number of the fins in the PD transistor of the SRAM may be referred as a fourth number "n32"; and n32=2. The number of the fins in the PG transistor of the SRAM may be referred as a fifth fin "n33"; and n33=1. When n32≥n33 and n33≥n31, the performance of the SRAM may be optimized.

Further, the first sub-layout may have a first region I and a second region II along the longitudinal direction of the first fin pattern 311 and the second fin patterns 312. The second fin patterns 312 in the first region I may be corresponding to the fins of the PG transistor of the SRAM. The second fin patterns 312 in the second region II may be corresponding to the fins of the PD transistor of the SRAM. The first fin pattern 311 in the first region I may be corresponding to the PU transistor of the SRAM.

Further, the first sub-layout may have a first part 301 and a second part 302 along the direction perpendicular to the first fin pattern 311 and the second fin patterns 312. Thus, the first fin pattern 311 and the second fin patterns 312 may be in the first part 301. The patterns in the first part 301 and the patterns in the second part 302 may be centrosymmetric. For illustrative purposes, only the patterns in the first part 301 are described.

The second sub-layout of the cell layout 300 of the SRAM is over the first sub-layout. The second sub-layout may include one first gate pattern 331 and one second gate pattern 332 parallel to the first gate pattern 331. The first gate pattern 331 may be used to form the gate structure of the PG transistor; and the second gate pattern 332 may be used to form the gate structure of the PD transistor and the PU transistor. Referring to FIGS. 4~5, the second sub-layout of the cell layout 300 may be identical to the second sub-layout of the cell layout 100 and the second sub-layout of the cell layout 200.

Further, the second sub-layout of the cell layout 200 may have a third part (not labeled) and a fourth part (not labeled) along a direction parallel to the first gate pattern 331 and the second gate pattern 332. The first gate pattern 331 and the second gate pattern 332 may be in the third part. The patterns in the fourth part and the patterns in the third part may be centrosymmetric. For illustrative purposes, only the patterns in the third part are described.

When the second sub-layout overlaps with the first sub-layout, the longitudinal direction of the first gate pattern 331 and the second gate pattern 332 may be perpendicular to the longitudinal direction of the first fin pattern 311 and the second fin patterns 322. Further, the first gate pattern 331 may be over the portion of the first fin pattern 311 in the first region I and the portions of the second fin patterns 312 in the first region I. Further, the second gate pattern 332 may be over the portion of the first fin pattern 311 in the second region II, and the portions of the second fin patterns 312 in the second region II. The first gate pattern 331 and the second gate pattern 232 in the second sub-layout may be corresponding to the gate patterns of the SRAM in a fabrication process.

Further, referring to FIG. 6, the portion of the first gate pattern 331 and the portion of the second fin pattern 312 in the first region I may form a PG transistor pattern 343 (in the dashed frame). The portion of the second gate pattern 332 and the portions of the second fin patterns 312 in the second region II may form a PD transistor pattern 342 (in the dashed frame). The portion of the second gate pattern 332 and the portion of the first fin pattern 311 in the second region II may form a PU transistor pattern 341 (in the dashed frame). The PG transistor pattern 343, the PD transistor pattern 342 and the PU transistor pattern 341 may be corresponding to the PG transistor, the PD transistor and the PU transistor of the SRAM, respectively, in a process for forming the SRAM.

Further, the third sub-layout of the cell layout 300 may be in between the first sub-layout and the second sub-layout. As shown in FIG. 6, the third sub-layout may include a first covering pattern 321 and a second covering pattern 322.

Referring to FIG. 6, the third sub-layout may have a fifth part (not labeled) and a sixth part (not labeled) along a direction perpendicular to the first fin pattern 311 and the second fin patterns 312. The first covering pattern 321 and the second covering pattern 322 may be in the fifth part. The patterns in the fifth part and the patterns in the sixth part may be centrosymmetric. For illustrative purposes, only the patterns in the fifth part are described.

Referring to FIG. 6, in the cell layout 300 of the SRAM, the first sub-layout, the second sub-layout and the third layout may entirely overlap with each other. By an appropriate design, the first covering pattern 221 may cover the first number (N31) of the first fin patterns 311 in the first region I. The second covering pattern 322 may cover a sixth number (N32-n33) of second fin patterns 312 in the first region I; a seventh number (N32-n32) of second fin patterns 312 in the second region II; and an eighth number (N31-n31) of first fin patterns 311 in the first region I. The first fin pattern 311 and the second fin patterns 312 covered by the first covering pattern 321 and the second covering pattern 322 may be corresponding to the portions of the fins on the substrate needed to be removed during a process for forming the SRAM.

In one embodiment, N31=1, N32=3, n31=1, n32=1, and n33=1. Thus, N32-n33=2; N32-n32=2; and N21-n21=0. Thus, the first covering pattern 321 may cover one first fin pattern 311 in the first region I; and the second covering pattern 322 may cover two second fin patterns 312 in the first region I; and two second fin patterns 312 in the second region II. That is, referring to FIG. 6, the second covering pattern 322 covers two entire second fin patterns 212 in the first region I and the second region II. In one embodiment, the two second fin patterns 312 covered by the second covering pattern 322 may be the most outside two in the cell layout 300. Thus, the area of the second covering pattern 322 may be relatively large. In a practical photolithography process, the process window may be relatively large. Thus, it may avoid damaging the adjacent second fin patterns 312. Further, when a plurality of SRAM units are firmed, the second covering patterns 322 of the third sub-layouts of the adjacent SRAM units may form a continuous pattern. In certain other embodiments, the second covering pattern 322 may also cover other second fin patterns 312 in other positions. The covered second fin patterns 312 and the covered, portions of the first fin patterns 311 may be corresponding to the fins and the portion of the fins needed to be removed from the substrate when the SRAM is being formed.

Further, referring to FIG. 6, the first covering pattern 321 may cover the portion of the first fin pattern 311 under the first gate pattern 331 and the portion of the first pattern 311 near the edge of the cell layout 300. A portion of the remaining portion of the first fin pattern 311 may be under the first gate pattern 331. When the SRAM is being formed, the adverse effect to the PU transistor pattern 341 may be avoided. In one embodiment, the length of the portion of the first fin pattern 311 under the first gate pattern 331 without being covered by the first covering pattern 321 may be equal to approximately one half of the width of the first gate pattern 331.

Further, referring to FIG. 6, the first part 301 of the first sub-layout, the third part of the second sub-layout, and the fifth part of the third sub-layout may entirely overlap. The second part 302 of the first sub-layout, the fourth part of the second sub-layout, and the sixth part of the third layout may entirely overlap. The patterns in first part 301, the third part and the fifth part may together be used to form a PU transistor, a PD transistor, and a PG transistor. The PU transistor, the PD transistor, and the PG transistor may form a first inverter. The patterns in first part 301, the third part and the fifth part may be centrosymmetric with the patterns in the second part 302, the fourth part and the sixth part. Thus, the patterns in the second part 302, the fourth part, and the sixth part may be used to form a second PU transistor, a second PD transistor and a second PG transistor. The second PU transistor, the second PD transistor and the second PG transistor may form a second inverter. The first inverter and the second inverter may be centrosymmetric. Thus, the SRAM may be formed by the first inverter and the second inverter. Such a SRAM may be referred as a 6T SRAM.

Therefore, by keeping the first sub-layout and second sub-layout to be identical to the first sub layout and the second sub-layout of the cell layout 100, and properly designing the covering patterns on the third sub-layout, the SRAM formed using the cell layout 300 may be identical to the SRAM formed using the cell layout illustrated in FIG. 1. That is, it may only need to change the third sub-layout to form different SRAM structures; and the first sub-layout and the second sub-layout may be kept same.

Figure 7:
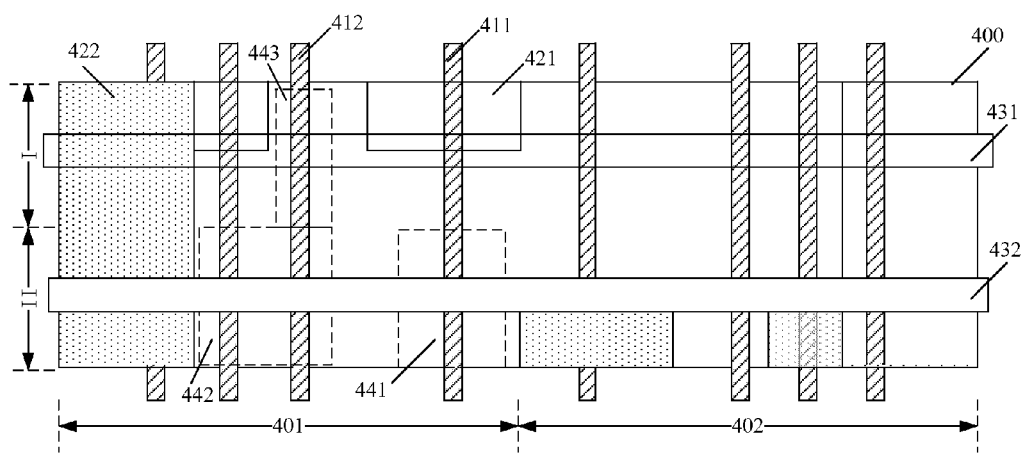

FIG. 7 illustrates another exemplary cell layout of a SRAM consistent with the disclosed embodiments. The cell layout 400 of the SRAM may include a first sub-layout (not labeled) on its bottom, a second sub-layout (not labeled) above the first sub-layout, and a third sub-layout (not labeled) disposed between first sub-layout and the second sub-layout.

As shown in FIG. 7, the first sub-layout of the cell layout 400 of the SRAM may include a first pattern (not labeled) and an adjacent second pattern (not labeled). The first pattern may include a plurality of parallel first fin patterns 411. The number of the first fin patterns may be referred as a first number "N41". The second pattern may include a plurality of second fin patterns 412. The number of the second fin patterns 412 may be referred as a second number "N42". N42 may be greater than N41. In one embodiment, N41=1 and N42=3. Therefore, the first sub-layout of the cell layout 400 may be identical to the first sub-layout of the cell layout 100, the first sub-layout of the cell layout 200, and the first sub-layout of the cell layout 300.

Further, in one embodiment, the number of the fins in the PU transistor of the SRAM may be may be referred as a third number "n41"; and n41=1. The number of the fins in the PD transistor of the SRAM may be referred as a fourth number "n42", and n42=2. The number of the fins in the PG transistor of the SRAM may be referred as a fifth number "n43"; and n43=1. When n42≥n43; and n43≥n41, the performance of the SRAM may be optimized.

Further, the first sub-Layout may have a first region I and a second region II along the longitudinal direction of the first fin pattern 411 and the second fin patterns 412. The second fin patterns 412 in the first region I may be corresponding to the fins of the PG transistor of the SRAM. The second fin patterns 412 in the second region II may be corresponding to the fins of the PD transistor of the SRAM. The first fin pattern 411 in the first region I may be corresponding to the PU transistor of the SRAM.

Further, the first sub-layout may have a first part 401 and a second part 402 along the direction perpendicular to the first fin pattern 411 and the second fin patterns 412. Thus, the first fin pattern 411 and the second fin patterns 412 may be in the first part 301. The patterns in the first part 401 and the patterns in the second part 402 may be centrosymmetric. For illustrative purposes, only the patterns in the first part 401 are described.

The second sub-layout of the cell layout 400 of the SRAM is over the first sub-layout. The second sub-layout may include a first gate pattern 431 and a second gate pattern 432 parallel to the first gate pattern 431. The first gate pattern 431 may be used to form the gate structure of the PG transistor, and the second gate pattern 432 may be used to form the gate structure of the PD transistor and the PU transistor. Referring, to FIGS. 4-6, the second sub-layout of the cell layout 400 may be identical to the second sub-layout of the cell layout 100, the second sub-layout of the cell layout 200, and the second sub-layout of the cell layout 300.

Further, the second sub-layout of the cell layout 400 may have a third part (not labeled) and a fourth part (not labeled) along a direction parallel to the first gate pattern 431 and the second gate pattern 432. The first gate pattern 431 and the second gate pattern 432 may be in the third part. The patterns in the fourth part and the patterns in the third part may be centrosymmetric. For illustrative purposes, only the patterns in the third part are described.

When the second sub-layout overlaps with the first sub-layout, the longitudinal direction of the first gate pattern 431 and the second gate pattern 432 may be perpendicular to the longitudinal direction of the first fin pattern 411 and the second fin patterns 412. Further, the first gate pattern 431 may be over the portion of the first fin pattern 411 in the first region I and the portion of the second fin patterns 412 in the first region I. Further, the second gate pattern 432 may be over the portion of the first fin pattern 411 in the second region II and the portion of the second fin pattern 412 in the second region II. The first gate pattern 431 and the second gate pattern 432 in the second sub-layout may be corresponding to the gate patterns of the SRAM in a fabrication process.

Further, referring to FIG. 7, the portion of the first gate pattern 431 and the portions of the second fin patterns 412 in the first region I may form a PG transistor pattern 443 (in the dashed frame). The portion of the second gate pattern 432 and the portions of the second fin patterns 412 the second region II may form a PD transistor pattern 442 (in the dashed frame). The portion of the second gate pattern 432 and the portion of first fin pattern 411 in the second region II may form a PU transistor pattern 441 (in the dashed frame). The PG transistor pattern 443, the PD transistor pattern 442 and the PU transistor pattern 441 may be corresponding to the PG transistor, the PD transistor, and the PU transistor of the SRAM, respectively, in a process for forming the SRAM.

Further, the third sub-layout of the cell layout 400 may be in between the first sub-lay out and the second sub-layout. As shown in FIG. 7, the third sub-layout may include a first covering pattern 421 and a second covering pattern 422.

Referring to FIG. 7, the third sub-layout may have a fifth part (not labeled) and a sixth part (not labeled) along a direction perpendicular to the first fin pattern 411 and the second fin patterns 412. The first covering pattern 421 and the second covering pattern 422 may be in the fifth part. The patterns in the fifth part and the patterns in the sixth part may be centrosymmetric. For illustrative purposes, only the patterns in the fifth part are described.

Further, referring to FIG. 7, in the cell layout 400 of the SRAM, the first sub-layout, the second sub-layout and the third layout may entirely overlap with each other. By an appropriate design, the first covering pattern 421 may cover the first number (N41) of the first fin patterns 411 in the first region I. The second covering pattern 422 may cover a sixth number (N42-n43) of second fin patterns 412 in the first region I; a seventh number (N42-n42) of second fin patterns 412 in the second region II; and an eighth number (N41-n41) of first fin patterns 411 in the first region I. The first fin patterns 411 and the second fin patterns 412 covered by the first covering pattern 421 and the second covering pattern 422 may be corresponding to the portions of the fins on the substrate needed to be removed during a process for forming the SRAM.

In one embodiment, N41=1, N42=3, n41=1, n42=2, and n43=1. Thus, N42-n43=2; N42-n42=1; and N41-n41=0. Thus, referring to FIG. 7 the first covering pattern 421 may cover one first fin pattern 411 in the first region I; and the second covering pattern 422 may cover two second fin patterns 412 in the first region I; and one second fin pattern 412 in the second region II. That is, the second covering pattern 422 may cover an entire second fin pattern 412 and a portion of the second fin pattern 412 in the first region I. In one embodiment, the second fin pattern 412 and the portion of the second fin pattern 412 covered by the second covering pattern 422 may be the most outside two in the cell layout 400. Thus, the area of the second covering patter 422 may be relatively large. In a practical photolithography process, the process window may be relatively large. Thus, it may avoid damaging the adjacent second fin patterns 312.

Further, when a plurality of SRAM units are formed, the second covering patterns 422 of the third sub-layouts of the adjacent SRAM units may form a continuous pattern. In certain other embodiments, the second covering pattern 422 may also cover other second fin patterns 412 in other positions. The covered second fin pattern 412 and the covered portion of the first fin patterns 411 may be corresponding to the fins and the portion of the fins needed to be removed from the substrate when the SRAM is being formed. A portion of the second fin pattern 412 partially covered by the second covering pattern 422 may be under the first gate pattern 431; and the other portion of the second fin pattern 412 partially covered by the second covering pattern 422 may be near the edge of the cell layout 400.

Further, referring to FIG. 7, the first covering pattern 421 may cover the portion of the first fin pattern 411 under the first gate pattern 431 and the portion of the first fin pattern 411 near the edge of the cell layout 400. A portion of the remaining portion of the first fin pattern 411 may be under the first gate pattern 431. When the SRAM is being formed, the adverse effect to the PU transistor pattern 341 may be avoided. In one embodiment, the length of the portion of the first fin pattern 411 under the first gate pattern 431 without being covered by the first covering pattern 421 may be equal to approximately one half of the width of the first gate pattern 431.

Further, referring to FIG. 7, the first part 401 of the first sub-layout, the third part of the second sub-layout and the fifth part of the third sub-layout may entirely overlap. The second part 402 of the first sub-layout, the fourth part of the second sub-layout, and the sixth part of the third layout may entirely overlap. The patterns in first part 401, the third part and fifth part may together be used to form a PU transistor, a PD transistor, and PG transistor. The PU transistor, the PD transistor and the PG transistor may form a first inverter.

The patterns in first part 401, the third part and fifth part may be centrosymmetric with the patterns in the second part 402, the fourth part and the sixth part. Thus, the patterns in the second part 402, the fourth part, and the sixth part may be used to form a second PU transistor, a second PD transistor and a second PG transistor. The second PU transistor, the second PD transistor and the second PG transistor may form a second inverter. The first inverter and the second inverter may be centrosymmetric. Thus, the SRAM may be formed by the first inverter and the second inverter. Such a SRAM may be referred as a 6T SRAM.

Therefore, by keeping the first sub-layout and second sub-layout to be identical to the first sub layout and the second sub-layout of the cell layout 100; and properly designing the covering patterns on the third sub-layout, SRAMs with different structures may be formed using the cell layout 400. That is, it may only need to change the third sub-layout to form different SRAM structures; and the first sub-layout and the second sub-layout may be kept same.

Figure 8:
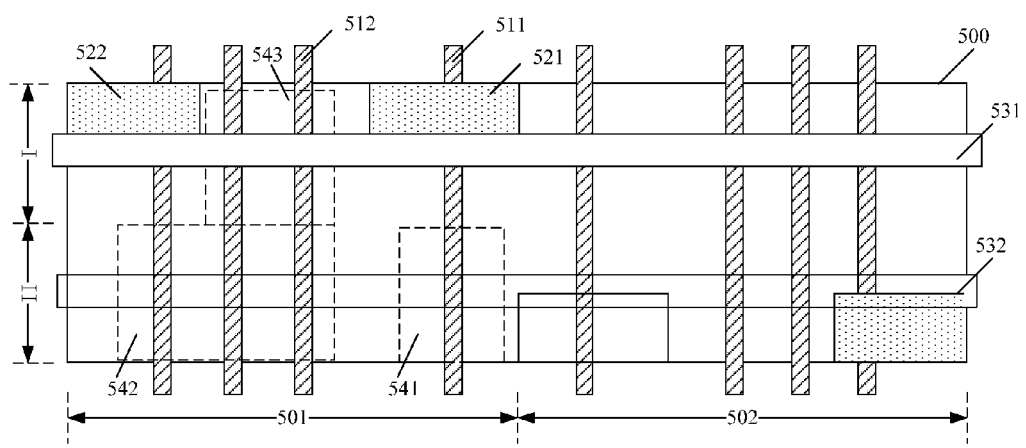

FIG. 8 illustrates another exemplary cell layout of a SRAM consistent with the disclosed embodiments. The cell layout 500 of the SRAM may include a first sub-layout (not labeled) on its bottom, a second sub-layout (not labeled) above the first sub-layout, and a third sub-layout (not labeled) disposed between first sub-layout and the second sub-layout.

As shown in FIG. 8, the first sub-layout of the cell layout 500 of the SRAM may include a first pattern (not labeled) and an adjacent second pattern (not labeled). The first pattern may include a plurality of parallel first fin patterns 511. The number of the first fin patterns may be referred as a first number "N51". The second pattern may include a plurality of second fin patterns 512. The number of the second fin patterns 512 may be referred as a second number "N52". N52 may be greater than N51. In one embodiment, N51=1 and N52=3. Therefore, the first sub-layout of the cell layout 500 may be identical to the first sub-layout of the cell layout 100, the first sub-layout of the cell layout 200, the first sub-layout of the cell layout 300, and the first sub-layout of the cell layout 400.

Further, in one embodiment, the number of the fins in the PU transistor of the SRAM may be referred as a third number "n51"; and n51=1. The number of the fins in the PD transistor of the SRAM may be referred as a fourth number "n52"; and n52=3. The number of the fins in the PG transistor of the SRAM may be referred as a fifth number "n53"; and n53=2. When n52≥n53 and n53≥n51, the performance of the SRAM may be optimized.

Further, the first sub-layout may have a first region I and a second region II along the longitudinal direction of the first fin pattern 511 and the second fin patterns 512. The second fin patterns 512 in the first region I may be corresponding to the fins of the PG transistor of the SRAM. The second fin patterns 512 in the second region II may be corresponding to the fins of the PD transistor of the SRAM. The first fin pattern 511 in the first region I may be corresponding to the PU transistor of the SRAM.

Further, the first sub-layout may have a first part 501 and a second part 502 along the direction perpendicular to the first fin pattern 511 and the second fin patterns 512. Thus, the first fin pattern 511 and the second fin patterns 512 may be in the first part 501. The patterns in the first part 501 and the patterns in the second part 502 may be centrosymmetric. For illustrative purposes, only the patterns in the first part 501 are described.

The second sub-layout of the cell layout 500 of the SRAM is over the first sub-layout. The second sub-layout may include one first gate pattern 531 and one second gate pattern 532 parallel to the first gate pattern 531. The first gate pattern 531 may be used to form the gate structure of the PG transistor, and the second gate pattern 532 may be used to form the gate structures of the PD transistor and the PU transistor. Referring to FIGS. 4~7, the second sub-layout of the cell layout 500 may be identical to the second sub-layout of the cell layout 100, the second sub-layout if the cell layout 200, the second sub-layout of the cell layout 300; and the second sub-layout of the cell layout 400.

Further, the second sub-layout of the cell layout 500 may have a third part (not labeled) and a fourth part (not labeled) along a direction parallel to the first gate pattern 531 and the second gate pattern 532. The first gate pattern 531 and the second gate pattern 532 may be in the third part. The patterns in the fourth part and the patterns in the third part may be centrosymmetric. For illustrative purposes, only the patterns in the third part are described.

When the second sub-layout overlaps with the first sub-layout, the longitudinal direction of the first gate pattern 531 and the second gate pattern 532 may be perpendicular to the longitudinal direction of the first fin pattern 511 and the second fin patterns 522. Further, the first gate pattern 531 may be over the portion of the first fin pattern 511 in the first region I and the portions of the second fin patterns 512 in the first region I. Further, the second gate pattern 532 may be over the portion of the first fin pattern 511 in the second region II and the portions of the second fin patterns 512 in the second region II. The first gate pattern 531 and the second gate pattern 532 in the second sub-layout may be corresponding to the gate patterns of the SRAM in a fabrication process.

Further, referring to FIG. 8, the portion of the first gate pattern 531 and the portions of the second fin patterns 512 in the first region I may form a PG transistor pattern 543 (in the dashed frame). The portion of the second gate pattern 532 and the portions of the second fin patterns 512 in the second region II may form a PD transistor pattern 542 (in the dashed frame). The portion of the second gate pattern 532 and the portion of the first fin pattern 511 in the second region II may form a PU transistor pattern 541 (in the dashed frame). The PG transistor pattern 543, the PD transistor pattern 542 and the PU transistor pattern 541 may be corresponding to the PG transistor, the PD transistor and the PU transistor of the SRAM, respectively, during a process for forming the SRAM.

Further, the third sub-layout of the cell layout 500 may be in between the first sub-layout and the second sub-layout. As shown in FIG. 8, the third sub-layout may include a first covering pattern 521 and a second covering pattern 522.

Referring to FIG. 8, the third sub-layout may have a fifth part (not labeled) and a sixth part (not labeled) along a direction perpendicular to the first fin pattern 511 and the second fin patterns 512. The first covering pattern 521 and the second covering pattern 522 may be in the fifth part. The patterns in the fifth part and the patterns in the sixth part may be centrosymmetric. For illustrative purposes, only the patterns in the fifth part are described.

Further, referring to FIG. 8, in the cell layout 500 of the SRAM, the first sub-layout, the second sub-layout and the third sub-layout may entirely overlap with each other. By an appropriate design, the first covering pattern 521 may cover the first number (N51) of the first fin patterns 511 in the first region I. The second covering pattern 522 may cover a sixth number (N52-n53) of second fin patterns 512 in the first region I; a seventh number (N52-n52) of second fin patterns 512 in the second region II; and an eighth number (N51-n51) of first fin patterns 511 in the first region I. The first fin patterns 511 and the second fin patterns 512 covered by the first covering pattern 521 and the second covering pattern 522 may be corresponding to the portions of the fins on the substrate needed to be removed to during a process for forming the SRAM.

In one embodiment, N51=1, N52=3, n51=1 n52=3, and n53=2. Thus, N52-n53=1; N52-n52=0; and N51-n51=0. Thus, referring to FIG. 8, the first covering pattern 521 may cover one first fin pattern 511 in the first region I; and the second covering pattern 522 may cover one second fin pattern 512 in the first region I. That is, one first fin pattern 511 may be partially covered; and one second fin pattern 512 may be partially covered. In one embodiment, the portion of the second fin pattern 512 covered by the second covering pattern 522 may be the most outside one in the cell layout 500. The covered portion of the second fin pattern 512 and the covered portion of the first fin pattern 511 may be corresponding to the portions of the fins needed to be removed from the substrate when the SRAM is being formed.

Further, referring to FIG. 8, the first covering pattern 521 may cover the portion of the first fin pattern 511 under the first gate pattern 531 and the portion of the first pattern 511 near the edge of the cell layout 500. A portion of the remaining portion of the first fin pattern 511 may be under the first gate pattern 531. When the SRAM is being formed, the adverse effect to the PU transistor pattern 541 may be avoided. In one embodiment, the length of the portion of the first fin pattern 511 under the first gate pattern 531 without being covered by the first covering pattern 521 may be equal to approximately one half of the width of the first gate pattern 531.

Further, referring to FIG. 8, the first part 501 of the first sub-layout, the third part of the second sub-layout and the fifth part of the third sub-layout may entirely overlap. The second part 502 of the first sub-layout, the fourth part of the second sub-layout and the sixth part of the third sub-layout may entirely overlap. The patterns in first part 501, the third part and fifth part may together be used to form a PU transistor, a PD transistor, and PG transistor. The PU transistor, the PD transistor and the PG transistor may form a first inverter. The patterns in first part, the third part and fifth part may be centrosymmetric with the patterns in the second part, the fourth part and the sixth part. Thus, the patterns in the second part, the fourth part and the sixth part may be used to form a second PU transistor, a second PD transistor and a second PG transistor. The second PU transistor, the second PD transistor and the second PG transistor may form a second inverter. The first inverter and the second inverter may be centrosymmetric. Thus, the SRAM may be formed by the first inverter and the second inverter. Such a SRAM may be referred as a 6T SRAM.

Therefore, by keeping the first sub-layout and the second sub-layout to be identical to the first sub-layout and the second sub-layout of the cell layout 100; and properly designing the covering patterns on the third sub-layout, the SRAMs with different structures may be formed using the cell layout 500. That is, it may only need to change the third sub-layout to form different SRAM structures; and the first sub-layout and the second sub-layout may be kept same.

Thus, a SRAM may be formed by using the above disclosed cell layouts. For illustrative purposes, the cell layout 500 is used for describing the fabrication process. Also for illustrative purposes, only the structures formed using the patterns in the first part of the first sub-layout, the third part of the second sub-layout, and the fifth pan of the third sub-layout of the cell layout 500 are described.

Figure 9:
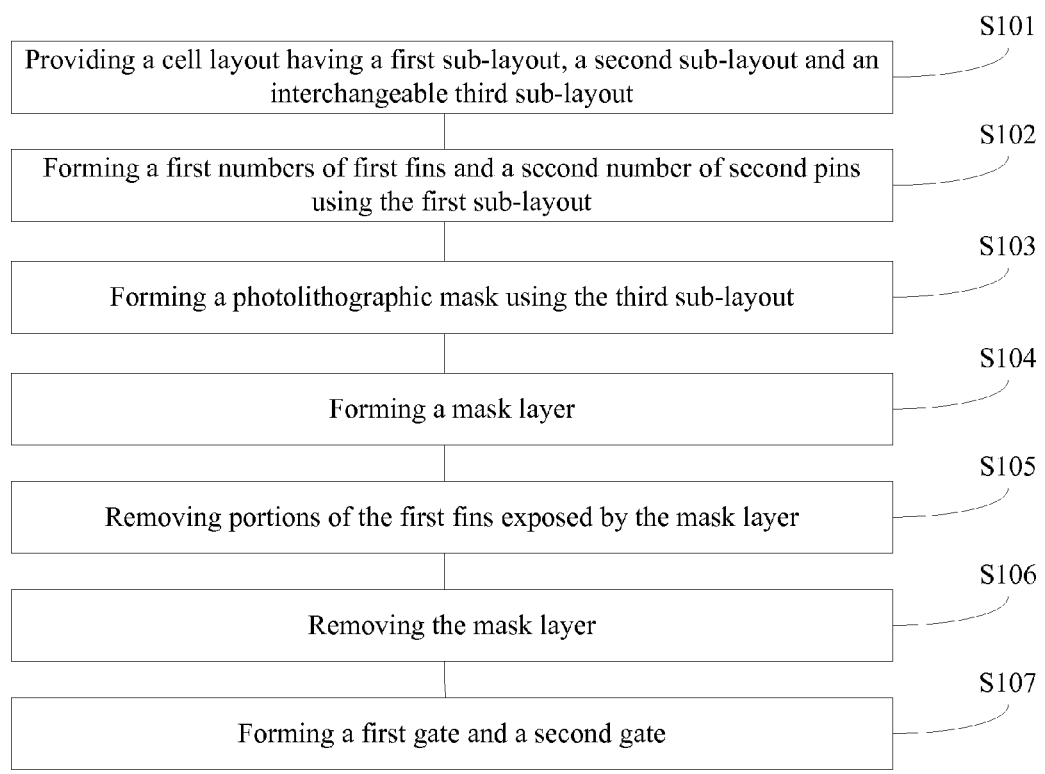
FIG. 9 illustrates an exemplary process for fabricating an SRAM consistent with the disclosed embodiments.

FIG. 9 illustrates an exemplary fabrication process of a SRAM according to the disclosed embodiments. As shown in FIG. 9, the process may include providing the cell layout 500 having the first sub-layout, the second sub-layout, and the third sub-layout (S101).

The method may also include providing a semiconductor substrate; and forming a first number (N51) of parallel first fins; and a second number (N52) of parallel second fins on the semiconductor substrate using the first sub-layout (S102). The first fins may be corresponding to the first fin pattern 511; and the second fins may be corresponding to the second fin patterns 512. Further, the semiconductor substrate may include a third region and a fourth region. The third region may be corresponding to the first region I of the first sub-layout of the cell layout 500; and the fourth region may be corresponding to the second region II of the first sub-layout of the cell layout 500.

The semiconductor substrate may include any appropriate semiconductor material such as, silicon, silicon germanium, or silicon on an insulator (SOI), etc. The first fins and the second fins may be formed by etching the semiconductor substrate. The first sub-layout may be used to form a photolithographic mask to etch the semiconductor substrate to form the first fins and the second fins. The first sub-layout may also be loaded into an e-beam lithography system or a focused ion beam (FIB) system to form the first fins and the second fins without a mask.

Further, the process may include forming a photolithographic mask using the third sub-layout of the cell layout 500 (S103). The transparent patterns of the photolithographic mask may be corresponding to the first covering pattern 521 and the second covering pattern 522 of the third sub-layout of the cell layout 500. The photolithographic mask may be formed by a direct laser writing process, or an e-beam lithography process, etc.

Further, the process may include forming a mask layer exposing a portion of the first fin in the third region, a portion of the second fin in the third region, zero second fin in the fourth region, and zero first fin in the fourth region (S104). Specifically, a process for forming the mask layer may include forming a mask material layer covering the first fins and the second fins on the semiconductor substrate; forming a photoresist layer on the mask material layer; exposing and developing the photoresist layer using the photolithographic mask to form a patterned photoresist layer; and etching the mask material layer using the patterned photoresist layer as an etching mask. Thus, the mask layer may be formed.

The mask material layer may be made of any appropriate material, such as silicon oxide, silicon nitride, or silicon oxynitride, etc. Various processes may be used to form the mask material layer; such as a chemical vapor deposition (CVD) process, a physical vapor deposition (PVD) process, or an atomic layer deposition (ALD) process, etc. The mask material layer may be etched by any appropriate process, such as a dry etching process, or a wet etching process.

Further, after forming the mask layer, the portions of the first fin and the second fin exposed by the mask layer may be removed (S105). Various processes may be used to remove the portions of the first fin and the second fin exposed by the mask layer, such as a dry etching process, or a wet etching process, etc.

Further, after removing the portions of the first fin and the second fin exposed by the mask layer, the mask layer may be removed. The removed portion of the first fin and the removed portions of the second fins may be corresponding to the first covering pattern 521 and the second covering pattern 522 of the third sub-layout of the cell layout 500. Various processes may be used to remove the mask layer, such as a dry etching process, or a wet etching process, etc.

Further, after removing the mask layer, a first gate and a second gate may be formed over the first fins and the second fins using the second sub-layout of the cell layout 500. The first gate may be in the first region; and the second gate may be in the second region. The first gate may be corresponding to the first gate pattern 531 in the second sub-layout; and the second gate may be corresponding to the second gate pattern 532 of the second sub-layout.

A process for forming the first gate and the second gate may include forming a gate dielectric material layer on the surface of the semiconductor substrate and the surfaces of the remaining first fins and second fins; forming a gate material layer on the gate dielectric layer; forming a patterned mask layer on the gate material layer, wherein the patterns in the patterned mask layer may be corresponding to the patterns of the third sub-layout; and etching the gate material layer and the gate dielectric layer using the patterned mask layer as an etching mask. Thus, the first gate and the second gate may be formed.

The gate dielectric layer may be made of any appropriate material, such as silicon oxide, or high dielectric constant material, etc. Various processes may be used to form the gate dielectric layer, such as a CVD process, a PVD process, or an ALD process, etc.

The gate material layer may be made of any appropriate material, such as polysilicon, doped polysilicon, or metal material, etc. Various process may be used to form the gate material layer, such as a CVD process, a PVD process, or a sputtering process, etc.

The gate dielectric layer and the gate material layer may be etched by any appropriate process, such as a dry etching process, or a wet etching process, etc. After etching the gate dielectric layer and the gate electric layer to form the first gate and the second gate, source/drain regions may formed in the first fins and the second fins at both sides of the first gate and the second gate.

Therefore, according to the disclosed cell layouts, in the cell layouts of different SRAMs, the first sub-layout and the second sub-layout may be kept same, it may only need to change the third sub-layout according to the different structures of the SRAMs. Using the covering pattern in the third sub-layout, the portions of the first patterns and the second patterns in the first sub-layout corresponding to the fins needed to be removed may be covered. The first sub-layout and the second sub-layout may be kept same. Therefore, in the cell layouts of different SRAMs, the first sub-layout and the second sub-layout may be shared during the process for forming the different SRAMs. Thus, the required mask area may be reduced.

Further, during the fabrication process of SRAMs with different structures, the patterns or the photolithographic mask corresponding the first sub-layout and the second sub-layout may not be changed; it may only need to change the photolithographic mask corresponding to the third sub-layout. Thus, the research and development cost may be reduced.

Further, during processes for forming different SRAMs using the disclosed cell layouts, the fins formed on the semiconductor substrate may be identical. It may only need to use different masks according to the patterns on the third sub-layout to remove the portions of the fins to form different SRAMs. Thus, the production cost of the SRAMs may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A layout of a static random access memory, comprising:
   a first sub-layout having a first pattern including a first number (N1) fins of first fin patterns and an adjacent second pattern having a second number (N2) fins of second fin patterns;
   a second sub-layout having a first gate pattern and a second gate pattern; and
   an interchangeable third sub-layout having a first covering pattern and a second covering pattern, wherein the first covering pattern is used for forming an active region of the static random access memory and the second covering pattern covers a first area of the second fin patterns and exposes a second area of the second fin patterns, the exposed second area of the second fin patterns defines a fin number in a transistor of the static random access memory.

2. The layout of the static random access memory according to claim 1, wherein:
   the first sub-layout has a first region and a second region along a direction parallel with the first fin patterns and the second fin patterns.

3. The layout of the static random access memory according to claim 2, wherein:
   transistors of the static random access memory are fin field-effect transistors;
   a pull-up transistor of the static random access memory has a third number (n1) of fins;
   a pull-down transistor of the static random access memory has a fourth number (n2) of fins; and
   a pass-gate transistor of the random access memory has a fifth number (n3) of fins.

4. The layout of the static random access memory according to claim 3, wherein:
   the first covering pattern and the second covering pattern cover the first number (N1) of first fin patterns in the first region, a six number (N2-n3) of second fin patterns in the first region, a seventh number (N2-n2) of second fin patterns in the second region, and an eighth number (N1-n1) first fin patterns in the second region.

5. The layout of the static random access memory according to claim 3, wherein:
   the second fin patterns in the first region are corresponding to the fins of the pass-gate transistor;
   the second fin patterns in the second region are corresponding to the fins of the pull-down transistor; and
   the first fin patterns in the second region are corresponding to the fins of the pull-up transistor.

6. The layout of the static random access memory according to claim 3, wherein:
   the first number (N1) is equal to the third number (n1).

7. The layout of the static random access memory according to claim 3, wherein:
   the third number (n1) is equal to 1 fin;
   the fourth number (n2) is in a range of 1~3 fins; and
   the fifth number is in a range of 1~3 fins.

8. The layout of the static random access memory according to claim 1, wherein:
   the exposed second area of the second fin patterns is adjacent to the first fin patterns.

9. The layout of the static random access memory according to claim 1, wherein:
   the first number (N1) is three times of the second number (N2).

10. The layout of the static random access memory according to claim 1, wherein:
    the first number (N1) is equal to 1 fin; and
    the second number (N2) is equal to 2 fins.

11. The layout of the static random access memory according to claim 1, wherein:
    the first sub-layout has a first part and a second part along a direction perpendicular to the first fin patterns;
    the second fin patterns and the first fin patterns are in the first part;
    patterns in the first part and patterns in the second part are centrosymmetric;
    the second sub-layout has a third part and a fourth part along a direction parallel to the first gate pattern and the second gate pattern;
    the first gate structure and the second gate structure are in the third part;
    patterns in the third part and patterns in the fourth part are centrosymmetric;
    the third sub-layout has a fifth part and a sixth part along a direction parallel to the first gate pattern and the second gate pattern;
    the first covering pattern and the second covering pattern are in the fifth part; and
    patterns in the fifth part and patterns in the sixth part are centrosymmetric.

12. A method for fabricating a static random access memory, comprising:
    providing a cell layout having a first pattern including a first number (N1) fins of first fin patterns and an adjacent second pattern having a second number (N2) fins of second fin patterns, a second sub-layout having a first gate pattern and a second gate pattern, and a changeable third sub-layout having a covering pattern variable for forming different static random memory when used with the first sub-layout and the second sub-layout, wherein the covering pattern covers an active region area of the first fin patterns corresponding to an active region of the static random access memory and a first area of the second fin patterns and exposes a second area of the second fin patterns;
    providing a semiconductor substrate;
    forming a plurality of first fins and a plurality of second fins on a surface of the semiconductor substrate using the first sub-layout;
    removing portions of the first fins and the second fins corresponding to portions of the first fin patterns and the second fin patterns covered by the covering pattern of the third sub-layout, wherein the exposed second area of the second fin patterns defines a fin number of the plurality of second fins; and
    forming a first gate and a second gate over remaining first fins and second fins using the second sub-layout.

13. The method according to claim 12, wherein:
    the first sub-layout has a first region and a second region along a direction parallel with the first fins and the second fins.

14. The method according to claim 13, wherein:
    transistors of the static random access memory are fin field-effect transistors;
    a pull-up transistor of the static random access memory has a third number (n1) of fins;
    a pull-down transistor of the static random access memory has a fourth number (n2) of fins; and
    a pass-gate transistor of the random access memory has a fifth number (n3) of fins.

15. The method according to claim 14, wherein:
    the covering pattern covers the first number (N1) fins of first fin patterns in the first region, a six number (N2-n3) fins of second fin patterns in the first region, a seventh number (N2-n2) fins of second fin patterns in the second region, and an eighth number (N1-n1) fins of first fin patterns in the second region.

16. The method according to claim 14, wherein:
the second fin patterns in the first region are corresponding to the fins of the pass-gate transistor;
the second fin patterns in the second region are corresponding to the fins of the pull-down transistor; and
the first fin patterns in the second region are corresponding to the fins of the pull-up transistor.

17. The method according to claim 14, wherein:
the first number (N1) is equal to the third number (n1).

18. The method according to claim 12, wherein:
the first number (N1) is three times of the second number (N2).

19. The method according to claim 12, wherein:
the exposed second area of the second fin patterns is adjacent to the first fin patterns.

20. The method according to claim 12, wherein removing portions of the first fins and the second fins using the third sub-layout further includes:

forming a photolithographic mask using the third sub-layout;

forming a mask material layer covering the surface of the semiconductor substrate, the first fins and the second fins;

forming a photoresist layer on the mask material layer;

exposing the photoresist layer using the photolithographic mask and developing the exposed photoresist layer to form a patterned photoresist layer;

etching the mask layer material layer using the pattered photoresist layer as an etching mask to expose portions the first fins and the second fins needed to be removed, corresponding to the covering patterns of the third sub-layout; and removing the exposed portions of the first fins and the second fins.

* * * * *